(12) United States Patent
Fujiwara et al.

(10) Patent No.: US 8,253,162 B2
(45) Date of Patent: Aug. 28, 2012

(54) GAN SUBSTRATE AND LIGHT-EMITTING DEVICE

(75) Inventors: Shinsuke Fujiwara, Itami (JP); Toshihiro Kotani, Itami (JP); Fumitake Nakanishi, Itami (JP); Seiji Nakahata, Itami (JP); Koji Uematsu, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 69 days.

(21) Appl. No.: 12/981,939

(22) Filed: Dec. 30, 2010

(65) Prior Publication Data

US 2011/0108852 A1 May 12, 2011

Related U.S. Application Data

(63) Continuation of application No. PCT/JP2010/069910, filed on Nov. 9, 2010.

(30) Foreign Application Priority Data

Apr. 27, 2010 (JP) .................................. 2010-102320

(51) Int. Cl.
*H01L 33/00* (2010.01)
(52) U.S. Cl. ...... 257/102; 257/76; 257/79; 257/E33.025
(58) Field of Classification Search .................. 257/102, 257/76, 79, E33.025
See application file for complete search history.

(56) References Cited

U.S. PATENT DOCUMENTS

| 2004/0124434 A1 | 7/2004 | D'Evelyn et al. |
| 2007/0051969 A1* | 3/2007 | Oshima et al. ................ 257/102 |
| 2007/0096147 A1* | 5/2007 | Oshima .......................... 257/189 |
| 2008/0012025 A1* | 1/2008 | Matsuoka et al. .............. 257/77 |
| 2010/0230713 A1 | 9/2010 | Minemoto et al. |

FOREIGN PATENT DOCUMENTS

| JP | 2005-213075 | 8/2005 |
| JP | 2006-513122 | 4/2006 |
| JP | 2007-070154 | 3/2007 |
| JP | 2007-126320 | 5/2007 |
| WO | 2007/083768 | 7/2007 |

OTHER PUBLICATIONS

Y. Oshima et al., "Thermal and optical properties of bulk GaN crystals fabricated through hydride vapor phase epitaxy with void-assisted separation", Journal of Applied Physics, vol. 98, pp. 103509-1 to 103509-4, Nov. 2005.

* cited by examiner

*Primary Examiner* — Victor A Mandala
*Assistant Examiner* — Errol Fernandes
(74) *Attorney, Agent, or Firm* — Drinker Biddle & Reath LLP

(57) ABSTRACT

The present GaN substrate can have an absorption coefficient not lower than 7 cm$^{-1}$ for light having a wavelength of 380 nm and light having a wavelength of 1500 nm, an absorption coefficient lower than 7 cm$^{-1}$ for at least light having a wavelength not shorter than 500 nm and not longer than 780 nm, and specific resistance not higher than 0.02 Ωcm. Here, the absorption coefficient for light having a wavelength not shorter than 500 nm and not longer than 780 nm can be lower than 7 cm$^{-1}$. Thus, a GaN substrate having a low absorption coefficient for light having a wavelength within a light emission wavelength region of a light-emitting device and specific resistance not higher than a prescribed value and being suitable for the light-emitting device is provided.

4 Claims, 3 Drawing Sheets

(A)

(B)

GAN SUBSTRATE AND LIGHT-EMITTING DEVICE

This is a continuation of application Serial No. PCT/JP2010/069910, filed Nov. 9, 2010, the contents of which are incorporated herein by reference.

BACKGROUND OF THE INVENTION

1. Field of the Invention

The present invention relates to a GaN substrate having high light transmittance in a red light region or in a visible light region from blue to red and having high conductivity as well as a light-emitting device including such a GaN substrate.

2. Description of the Background Art

A substrate having high light transmittance and high conductivity is demanded as a substrate for use in a light-emitting device. For example, Japanese Patent Laying-Open No. 2005-213075 (Patent Document 1) discloses a GaN substrate having an absorption coefficient from 7 $cm^{-1}$ to 68 $nm^{-1}$ for light having a wavelength from 375 nm to 500 nm. In addition, Japanese Patent Laying-Open No. 2007-126320 (Patent Document 2) discloses obtaining a GaN substrate of which absorption coefficient for light having a wavelength not shorter than 380 nm is lower than 7 $cm^{-1}$, with a method of forming a TiN thin film having a large number of small holes on the substrate and growing a GaN crystal on the TiN thin film while suppressing introduction of an impurity other than Si (this method being referred to as a VAS (Void-Assisted Separation) method)).

SUMMARY OF THE INVENTION

Light transmittance and conductivity, however, are mutually contradictory. If an impurity in a substrate is decreased for increasing light transmittance, conductivity becomes lower. If an impurity in a substrate is increased for enhancing conductivity, light transmittance becomes lower.

For example, Japanese Patent Laying-Open No. 2005-213075 (Patent Document 1) could achieve lowering in absorption coefficient only to approximately 7 $cm^{-1}$ for light having a wavelength from 375 nm to 500 nm, in order to maintain prescribed conductivity.

Meanwhile, Japanese Patent Laying-Open No. 2007-126320 (Patent Document 2) discloses a GaN substrate maintaining prescribed conductivity, of which absorption coefficient for light having a wavelength not shorter than 380 nm is lower than 7 $cm^{-1}$, however, such a substrate is very expensive because it is fabricated with the aforementioned special method referred to as the VAS method.

In addition, a substrate for a light-emitting device suffices if it has a low absorption coefficient for light having a wavelength in a light emission wavelength region, and it does not have to have a low absorption coefficient even for light having a wavelength outside the light emission wavelength region.

Therefore, from a point of view above, an object of the present invention is to provide a GaN substrate having a low absorption coefficient for light having a wavelength within a light emission wavelength region of a light-emitting device and specific resistance not higher than a prescribed value and being suitable for the light-emitting device as well as a light-emitting device including such a GaN substrate.

According to one aspect, the present invention is directed to a GaN substrate having an absorption coefficient not lower than 7 $cm^{-1}$ for light having a wavelength of 380 nm and light having a wavelength of 1500 nm, an absorption coefficient lower than 7 $cm^{-1}$ for at least light having a wavelength not shorter than 500 nm and not longer than 780 nm, and specific resistance not higher than 0.02 Ωcm.

In the GaN substrate according to the present invention, an absorption coefficient for light having a wavelength not shorter than 440 nm and not longer than 780 nm can be lower than 7 $cm^{-1}$.

In addition, according to another aspect, the present invention is directed to a light-emitting device including the GaN substrate described above, of which absorption coefficient for light having a wavelength of 380 nm and light having a wavelength of 1500 nm is not lower than 7 $cm^{-1}$, of which absorption coefficient for at least light having a wavelength not shorter than 500 nm and not longer than 780 nm is lower than 7 $cm^{-1}$, and of which specific resistance is not higher than 0.02 Ωcm, and having a light emission peak wavelength not shorter than 500 nm and not longer than 780 nm.

Moreover, according to yet another aspect, the present invention is directed to a light-emitting device including the GaN substrate described above, of which absorption coefficient for light having a wavelength of 380 nm and light having a wavelength of 1500 nm is not lower than 7 $cm^{-1}$, of which absorption coefficient for light having a wavelength not shorter than 440 nm and not longer than 780 nm is lower than 7 $cm^{-1}$, and of which specific resistance is not higher than 0.02 Ωcm, and having a light emission peak wavelength not shorter than 440 nm and not longer than 780 nm.

According to the present invention, a GaN substrate having a low absorption coefficient for light having a wavelength within a light emission wavelength region of a light-emitting device and specific resistance not higher than a prescribed value and being suitable for the light-emitting device as well as a light-emitting device including such a GaN substrate can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[GaN Substrate]

Figure 1:
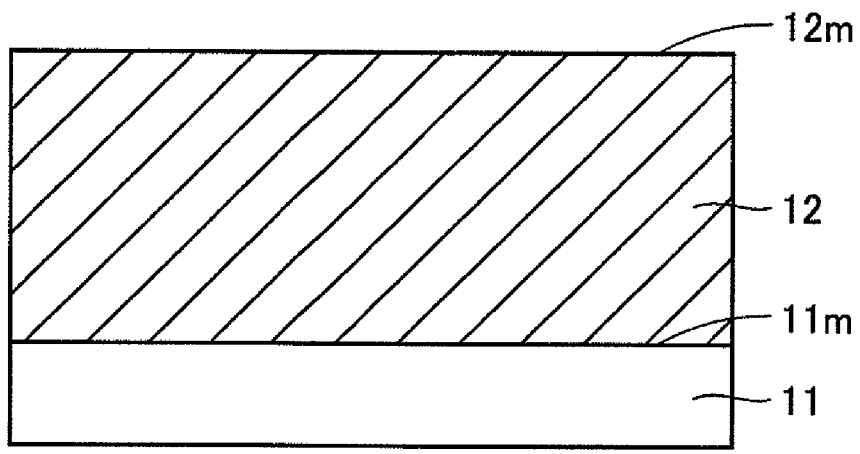
FIG. 1 is a schematic cross-sectional view showing an example of a method of manufacturing a GaN substrate according to the present invention, with (A) showing the step of preparing an underlying substrate and the step of growing a GaN crystal, to which an impurity has been added, on the underlying substrate, and (B) showing the step of forming the GaN substrate by working the GaN crystal.
Figure 1:
Figure 1:
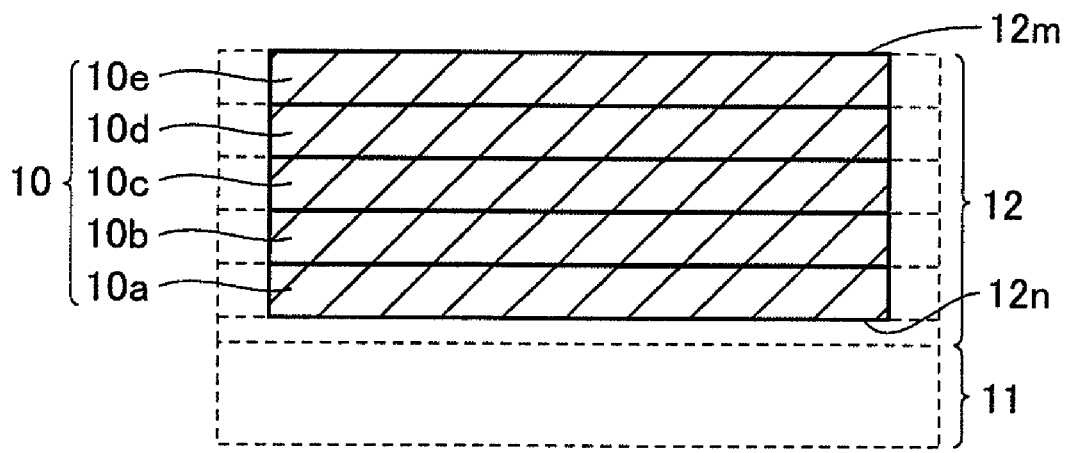

A GaN substrate according to the present invention has an absorption coefficient not lower than 7 $cm^{-1}$ for light having a wavelength of 380 nm and light having a wavelength of 1500 nm, an absorption coefficient lower than 7 $cm^{-1}$ for at least light having a wavelength not shorter than 500 nm and not longer than 780 nm, and specific resistance not higher than 0.02 Ωcm. Here, the light absorption coefficient is calculated by measuring transmittance and reflectance of light having a wavelength of interest by using a spectrophotometer. Specific resistance is measured with a four-probe method by using a specific resistance meter.

Such a GaN substrate is suitably used as a GaN substrate for a light-emitting device having at least a light emission peak wavelength not shorter than 500 nm and not longer than 780 nm. More specific embodiments will be described hereinafter.

First Embodiment

A GaN substrate according to the present embodiment has an absorption coefficient not lower than 7 cm$^{-1}$ for light having a wavelength of 380 nm and light having a wavelength of 1500 nm, an absorption coefficient lower than 7 cm$^{-1}$ for light having a wavelength not shorter than 500 nm and not longer than 780 nm, and specific resistance not higher than 0.02 Ωcm. The GaN substrate according to the present embodiment is suitably used as a substrate for a light-emitting device having a light emission peak wavelength in a red light region not shorter than 500 nm and not longer than 780 nm. From such a point of view, an absorption coefficient for light having a wavelength not shorter than 500 nm and not longer than 780 nm is preferably not higher than 5 cm$^{-1}$ In addition, specific resistance is preferably not higher than 0.015 Ωcm.

Second Embodiment

A GaN substrate according to the present embodiment has an absorption coefficient not lower than 7 cm$^{-1}$ for light having a wavelength of 380 nm and light having a wavelength of 1500 nm, an absorption coefficient lower than 7 cm$^{-1}$ for light having a wavelength not shorter than 440 nm and not longer than 780 nm, and specific resistance not higher than 0.02 Ωcm. The GaN substrate according to the present embodiment is suitably used as a substrate for a light-emitting device having a light emission peak wavelength in a visible light region from a blue light region to a red light region, which is not shorter than 440 nm and not longer than 780 nm. From such a point of view, an absorption coefficient for light having a wavelength not shorter than 440 nm and not longer than 780 nm is preferably not higher than 5 cm$^{-1}$. In addition, specific resistance is preferably not higher than 0.015 Ωcm.

The GaN substrate in any embodiment above preferably has carrier concentration not lower than $5 \times 10^{17}$ cm$^{-3}$ and not higher than $2 \times 10^{18}$ cm$^{-3}$. If the carrier concentration is too low, specific resistance becomes excessively high. If the carrier concentration is too high, the light absorption coefficient becomes excessively high. From such a point of view, the carrier concentration is further preferably not lower than $7 \times 10^{17}$ cm$^{-3}$ and not higher than $1.1 \times 10^{18}$ cm$^{-3}$. Here, the carrier concentration is measured with a CV characteristics measurement method.

The GaN substrate in any embodiment above preferably has average density of dislocation penetrating a main surface thereof (referred to as average dislocation density; to be understood similarly hereinafter), not higher than $3 \times 10^{6}$ cm$^{-2}$. As such average density of dislocation is lower, a more reliable light-emitting device is obtained. From such a point of view, average density of dislocation penetrating the main surface (average dislocation density) is further preferably not higher than $1 \times 10^{6}$ cm$^{-2}$. In addition, from a point of view of the state-of-the-art technique for manufacturing a substrate, it is at present difficult to make average density of dislocation penetrating the main surface (average dislocation density) lower than 10 cm$^{-2}$, and therefore average dislocation density is approximately 10 cm$^{-2}$ or higher. Average density of dislocation penetrating the main surface of the GaN substrate is calculated based on measurement of dark spot density with CL (cathode luminescence).

Preferably, the GaN substrate in any embodiment above has a flat main surface and a radius of curvature of a crystal plane closest to the main surface is 10 m or greater. As such a radius of curvature of the crystal plane is greater, a light-emitting device having a uniform light emission wavelength in a substrate plane is obtained. From such a point of view, a radius of curvature of the crystal plane closest to the main surface is further preferably 20 m or greater. In addition, from a point of view of the state-of-the-art technique for manufacturing a substrate, it is at present difficult to make a radius of curvature of the crystal plane closest to the main surface greater than 100 m, and therefore it is approximately 100 m or smaller. The radius of curvature of the crystal plane closest to the main surface of the GaN substrate is measured with X-ray diffraction for the crystal plane of interest.

The crystal plane closest to the main surface of the GaN substrate is not particularly restricted, however, from a point of view of epitaxial growth of a semiconductor layer having high crystallinity on the main surface, a {0001} plane, a {10-10} plane, a {11-20} plane, a {10-11} plane, a {11-22} plane, a {20-21} plane, a {22-44} plane, and the like are preferred. In addition, from a point of view of epitaxial growth of a semiconductor layer having high crystallinity on the main surface of the GaN substrate, the main surface of the GaN substrate preferably has an absolute value of an off angle not greater than 5°, with respect to the crystal plane above. Here, a plane orientation of the crystal plane closest to the GaN substrate and the off angle between the main surface and the crystal plane are measured with X-ray diffraction.

[Method of Manufacturing GaN Substrate]

FIG. 1 is a schematic cross-sectional view showing an example of a method of manufacturing a GaN substrate according to the present invention. A method of manufacturing a GaN substrate according to the present invention is not particularly restricted, however, referring to FIG. 1, the method includes the step of preparing an underlying substrate 11, the step of growing a GaN crystal 12, to which an impurity has been added, on underlying substrate 11, and the step of forming a GaN substrate 10 by working GaN crystal 12. In such a manufacturing method, by adjusting concentration of an impurity (referred to as a dopant; to be understood similarly hereinafter) added to GaN crystal 12, GaN substrate 10 according to the present embodiment is obtained with low cost.

(Step of Preparing Underlying Substrate)

Referring to FIG. 1(A), underlying substrate 11 prepared in the step of preparing underlying substrate 11 is not particularly restricted so long as it is a substrate on which GaN crystal 12 can epitaxially be grown, however, from a point of view of high characteristics of lattice matching with the GaN crystal, a silicon (Si) underlying substrate, a sapphire ($Al_2O_3$) underlying substrate, a GaAs underlying substrate as well as a group III nitride underlying substrate such as a GaN underlying substrate and an AlN underlying substrate, and the like are preferably employed, and among others, a GaN underlying substrate is particularly preferably employed. A GaN underlying substrate is preferably used, because it can suppress introduction of an impurity from the underlying substrate. From this point of view, cleanliness of a surface of the underlying substrate is important. In particular, since a back surface of the substrate (referring to a surface of the underlying substrate in contact with an inner wall of a growth furnace; to be understood similarly hereinafter) cannot be etched within the growth furnace before crystal growth, it is necessary to improve cleanliness before placement into the growth furnace. Therefore, the substrate is preferably placed in the growth furnace after the back surface of the substrate is etched. Examples of etching methods include wet etching using an alkali solvent, dry etching using a halogen-based gas, and the like.

(Step of Growing GaN Crystal to which Impurity has been Added)

Referring to FIG. 1(A), a method of growing GaN crystal 12, to which an impurity has been added, on underlying substrate 11 above is not particularly restricted so long as a method can achieve epitaxial growth, however, from a point of view of growing GaN crystal 12 having high crystallinity, such vapor phase methods as an HVPE (hydride vapor phase epitaxy) method, an MOCVD (metal organic chemical vapor deposition) method, and an MBE (molecular beam epitaxy) method are preferred, and among others, from a point of view of high rate of crystal growth, the HVPE method is particularly preferred.

Here, with the HVPE method, since a crystal is normally grown within a quartz reaction tube, the quartz reaction tube is also heated together with the crystal in order to heat the crystal within the quartz reaction tube. Therefore, a decomposition gas from the quartz reaction tube heated to a high temperature is taken into the crystal as an impurity. Then, the inside of the quartz reaction tube is preferably covered with a liner tube formed with a material stable under a growth temperature (for example, pBN (pyrolytic boron nitride)). In addition, stay of an impurity is preferably avoided by feeding a purge gas for purging a gap between the quartz reaction tube and the liner tube (such as $H_2$, $N_2$ and/or Ar). Moreover, since a temperature of a susceptor on which the underlying substrate is arranged becomes also high, preferably, such a susceptor is formed of pBN or a surface of the susceptor is coated with a high-purity and stable material such as pBN, MN, $Al_2O_3$, or SiC.

An impurity (a dopant) added to GaN crystal 12 is not particularly restricted, however, from a point of view of less lowering in light absorption coefficient and low specific resistance, Si is preferred. In addition, a method of adding Si to GaN crystal 12 is not particularly restricted, however, a gas containing Si, such as an $SiF_4$ (silicon tetrafluoride) gas, an $SiH_4$ (silane) gas, an $Si_2H_6$ (disilane) gas, an $SiH_3Cl$ (monochlorosilane) gas, an $SiH_2Cl_2$ (dichlorosilane) gas, an $SiHCl_3$ (trichlorosilane) gas, or an $SiCl_4$ (silicon tetrachloride) gas, is preferably used as a doping gas, and among others, the $SiF_4$ gas is particularly preferably used. The $SiF_4$ gas is less likely to be decomposed than other Si-containing gases even under a high temperature not lower than 900° C. and not higher than 1300° C., and therefore, it can efficiently be added to GaN crystal 12.

Figure 2:
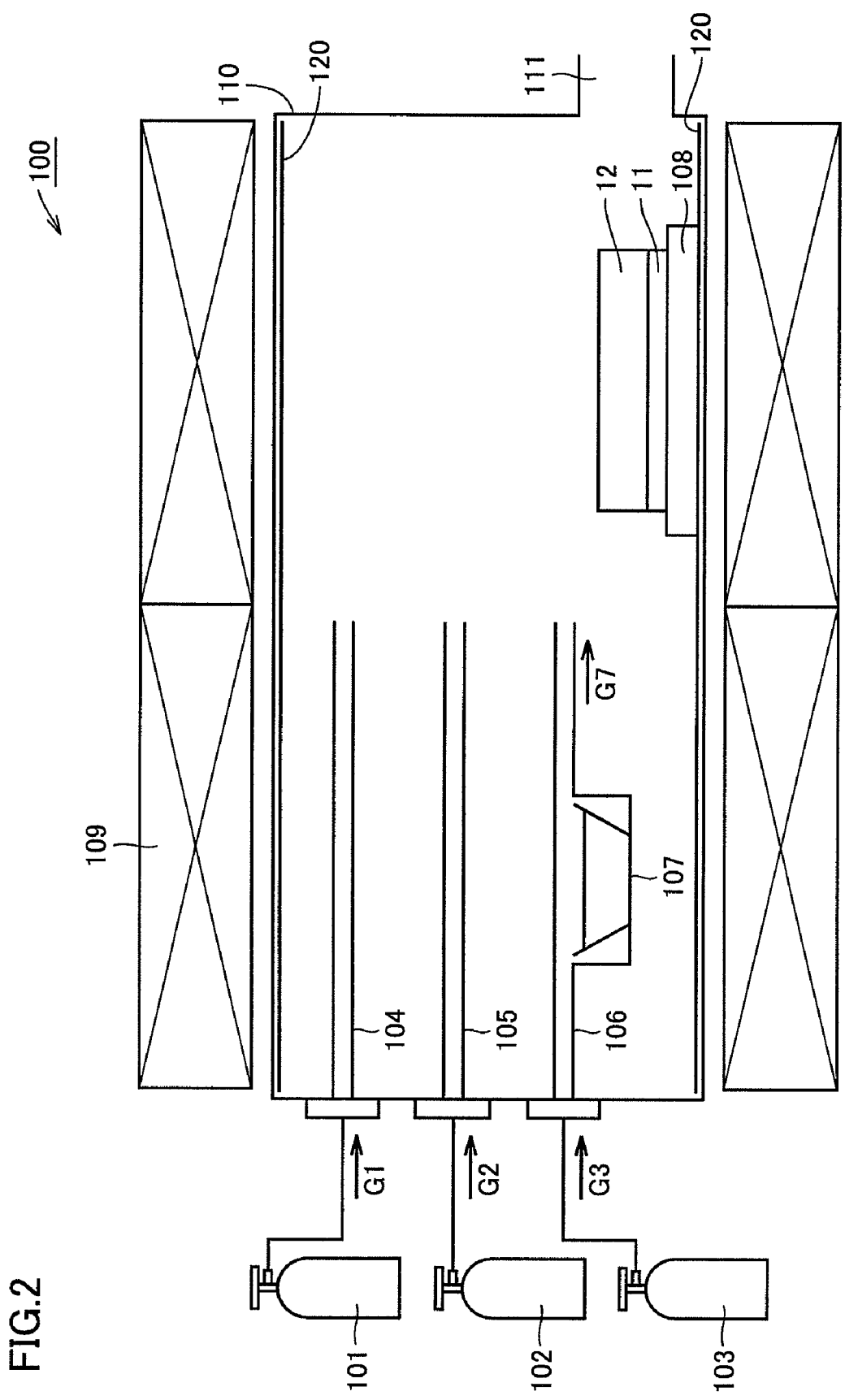
FIG. 2 is a schematic diagram showing an example of an HVPE apparatus used for growing the GaN crystal.

For example, a method of growing GaN crystal 12, to which Si has been added as a dopant, with the HVPE method will be described hereinafter. FIG. 2 is a schematic diagram showing an example of an HVPE apparatus used for growing GaN crystal 12. Referring to FIG. 2, an HVPE apparatus 100 includes a first source gas canister 101, a doping gas canister 102, a second source gas canister 103, a first gas introduction pipe 104, a doping gas introduction pipe 105, a second gas introduction pipe 106, a source boat 107, a susceptor 108, a heater 109, a reaction tube 110, an exhaust pipe 111, and an exhaust gas treatment apparatus. HVPE apparatus 100 is implemented, for example, by a horizontal reaction tube. It is noted that HVPE apparatus 100 may be implemented by a vertical reaction tube.

Reaction tube 110 is a vessel for holding underlying substrate 11 therein and growing GaN crystal 12 on underlying substrate 11. For example, a quartz reaction tube or the like may be employed as reaction tube 110. In addition, a liner tube 120 made of pBN is arranged in reaction tube 110. Raw materials containing elements forming a GaN crystal to be grown are supplied to first source gas canister 101, second source gas canister 103, and source boat 107, respectively. Doping gas canister 102 is filled, for example, with the $SiF_4$ gas as a gas containing Si which is a dopant. First gas introduction pipe 104, doping gas introduction pipe 105 and second gas introduction pipe 106 are provided in reaction tube 110 in order to introduce a first source gas G1, a doping gas G2 and a second source gas G3, respectively, from the outside of reaction tube 110 to the inside thereof. Source boat 107 contains and holds, for example, metal Ga as a metal raw material for a GaN crystal and it is arranged within second gas introduction pipe 106.

Susceptor 108 has its surface coated with a film made of pBN and carries underlying substrate 11. Susceptor 108 is arranged such that the surface on which underlying substrate 11 is carried thereby is located under first gas introduction pipe 104, doping gas introduction pipe 105, and second gas introduction pipe 106 within reaction tube 110. Susceptor 108 is arranged horizontally in reaction tube 110. Though susceptor 108 is structured such that the main surface of underlying substrate 11 is arranged horizontally in FIG. 2, it may be structured such that the main surface of the underlying substrate is vertically arranged. In addition, HVPE apparatus 100 may further include a local heating mechanism for heating, such as a resistance heater for underlying substrate 11.

Heater 109 is arranged outside reaction tube 110, and has ability to heat the inside of reaction tube 110 as a whole, for example, to a temperature not lower than 700° C. and not higher than 1500° C. Exhaust pipe 111 is provided in reaction tube 110 in order to discharge a gas after reaction to the outside of reaction tube 110. The exhaust gas treatment apparatus is structured to make a gas after reaction discharged from exhaust pipe 111 harmless, in order to decrease burdens on an environment.

As shown in FIG. 2, initially, prepared underlying substrate 11 is placed on susceptor 108. Here, a plurality of underlying substrates 11 may be placed on susceptor 108.

Then, first source gas canister 101 and second source gas canister 103 filled with an $NH_3$ (ammonia) gas serving as the first source gas and an HCl (hydrogen chloride) gas serving as the second source gas respectively are prepared. In addition, metal Ga is supplied to source boat 107. Further, doping gas canister 102 filled with the $SiF_4$ gas serving as a doping gas is prepared.

Thereafter, source boat 107 is heated. Then, the HCl gas (second source gas G3) supplied through second gas introduction pipe 106 and metal Ga in source boat 107 are caused to react to each other, to generate a GaCl (gallium chloride) gas (a reaction gas G7). The $NH_3$ gas (first source gas G1) supplied through first gas introduction pipe 104, the $SiF_4$ gas (doping gas G2), and the GaCl gas (reaction gas G7) are fed (supplied) to impinge the main surface of underlying substrate 11, to thereby cause reaction. Here, a carrier gas for carrying these gases to underlying substrate 11 may be employed. For example, an inert gas such as an $N_2$ (nitrogen) gas, an $H_2$ (hydrogen) gas, and an Ar (argon) gas can be used as a carrier gas.

With the HVPE method, heater 109 is used to heat the inside of reaction tube 110 to a temperature at which GaN crystal 12 grows at an appropriate rate. The temperature for growing GaN crystal 12 is preferably not lower than 900° C. and not higher than 1300° C. and further preferably not lower than 1050° C. and not higher than 1200° C. In growing GaN crystal 12 at 900° C. or higher, occurrence of defects of GaN crystal 12 can be prevented, and occurrence of a plane having a plane orientation different from a plane orientation in which growth on a crystal growth plane is to be achieved (for example, in a case where a plane orientation in which growth is to be achieved is (0001) (c plane), a facet having a plane orientation different from (0001), a pit formed with such a facet, or the like) can be suppressed. Namely, GaN crystal 12 having stable and good crystallinity with respect to a plane orientation of the crystal growth plane in which growth is to be achieved can be grown. In growing GaN crystal 12 at 1050° C. or higher, crystallinity can be better. On the other hand, in growing GaN crystal 12 at 1300° C. or lower, decomposition of GaN crystal 12 to be grown can be suppressed and hence deterioration of crystallinity thereof can be suppressed. In growing GaN crystal 12 at 1200° C. or lower, deterioration of crystallinity can further be suppressed.

Here, an inclination angle from the (0001) plane, of a crystal growth surface of the GaN crystal to be grown is preferably smaller than 1°. By setting the inclination angle of the crystal growth plane from the (0001) plane to smaller than 1° in the GaN crystal, taking-in of an impurity other than a doping gas into the crystal growth surface can be suppressed. In order to set the inclination angle from the (0001) plane, of the crystal growth surface of the GaN crystal to smaller than 1°, a crystal growth temperature is preferably set to 1100° C. or higher. In addition, by optimizing a manner of flow and a flow rate of a source gas, a carrier gas and a doping gas above, the inclination angle from the (0001) plane can be made smaller than 1° in substantially the entire region of the crystal growth surface (from 80% or higher to 100%).

A partial pressure of a gas containing Si (the $SiF_4$ gas) during growth of GaN crystal 12 is preferably not lower than $2.0 \times 10^{-7}$ atm and not higher than $1.0 \times 10^{-5}$ atm. When the partial pressure of the gas containing Si (the $SiF_4$ gas) is not lower than $2.0 \times 10^{-7}$ atm, Si serving as an n-type dopant is sufficiently taken into GaN crystal 12. On the other hand, when the partial pressure of the gas containing Si (the $SiF_4$ gas) is not higher than $1.0 \times 10^{-5}$ atm, generation of an $Si_xN_y$ (silicon nitride)-based compound can further be suppressed and hence doping conditions in doping GaN crystal 12 with Si can better be controlled. Considering concentration of Si for doping of GaN crystal 12, the partial pressure of the gas containing Si (the $SiF_4$ gas) is not higher than $1.0 \times 10^{-5}$ atm. It is noted that the total partial pressures (sum) of the gases included in reaction tube 110, such as the source gas, the carrier gas, the doping gas, and the like, is 1 atm. The concentration of the gas containing Si (the $SiF_4$ gas) is in proportion to the partial pressure.

In the step of growing a GaN crystal, to which an impurity has been added, the doping gas is supplied to underlying substrate 11 such that carrier concentration in GaN crystal 12 is preferably not lower than $5 \times 10^{17}$ cm$^{-3}$ and not higher than $1.5 \times 10^{18}$ cm$^{-3}$ (corresponding Si concentration being not lower than $5 \times 10^{17}$ cm$^{-3}$ and not higher than $1.6 \times 10^{18}$ cm$^{-3}$) and further preferably not lower than $6.6 \times 10^{17}$ cm$^{-3}$ and not higher than $1.1 \times 10^{18}$ cm$^{-3}$ (corresponding Si concentration being not lower than $6.9 \times 10^{17}$ cm$^{-3}$ and not higher than $1.1 \times 10^{18}$ cm$^{-3}$). When the carrier concentration is not lower than $5 \times 10^{17}$ cm$^{-3}$, specific resistance of GaN crystal 12 can be lowered and conductivity can sufficiently be ensured. When the carrier concentration is not lower than $6.6 \times 10^{17}$ cm$^{-3}$, specific resistance of GaN crystal 12 can further be lowered and conductivity can further sufficiently be ensured. On the other hand, when the carrier concentration is not higher than $1.5 \times 10^{18}$ cm$^{-3}$, a light absorption coefficient of the GaN crystal can be lowered and a light transmitting characteristic can sufficiently be ensured. When the carrier concentration is not higher than $1.1 \times 10^{18}$ cm$^{-3}$, a light absorption coefficient of the GaN crystal can further be lowered and a light transmitting characteristic can further sufficiently be ensured. Moreover, an amount of dope of an impurity other than Si (such as oxygen or carbon) is preferably not greater than ⅕ of an Si dope amount, further preferably not greater than 1/10 thereof, and still further preferably not greater than 1/20 thereof.

In the step of growing GaN crystal 12, to which an impurity has been added, GaN crystal 12 is grown so as to have specific resistance not higher than 0.02 Ωcm and preferably not higher than 0.015 Ωcm. When specific resistance is not higher than 0.02 Ωcm, GaN crystal 12 having conductivity and suitably used for a substrate for a light-emitting device can be grown. When specific resistance of the GaN crystal is not higher than 0.015 Ωcm, the GaN crystal is more suitably used for a substrate for a light-emitting device.

In the step of growing GaN crystal 12, to which an impurity has been added, regarding GaN crystal 12, the GaN crystal is grown such that an absorption coefficient for light having a wavelength not shorter than 500 nm and not longer than 780 nm is lower than 7 cm$^{-1}$ and preferably not higher than 5 cm$^{-1}$. When GaN crystal 12 has an absorption coefficient lower than 7 cm$^{-1}$ and preferably not higher than 5 cm$^{-1}$, for light having a wavelength not shorter than 500 nm and not longer than 780 nm, GaN crystal 12 is suitably used for a substrate for a light-emitting device having a light emission peak wavelength not shorter than 500 nm and not longer than 780 nm.

In the step of growing GaN crystal 12, to which an impurity has been added, regarding GaN crystal 12, the GaN crystal is grown such that an absorption coefficient for light having a wavelength not shorter than 440 nm and not longer than 780 nm is lower than 7 cm$^{-1}$ and preferably not higher than 5 cm$^{-1}$. When GaN crystal 12 has an absorption coefficient lower than 7 cm$^{-1}$ and preferably not higher than 5 cm$^{-1}$, for light having a wavelength not shorter than 440 nm and not longer than 780 nm, GaN crystal 12 is suitably used for a substrate for a light-emitting device having a light emission peak wavelength not shorter than 440 nm and not longer than 780 nm.

In the step of growing a GaN crystal, to which an impurity has been added, GaN crystal 12 is grown such that average density of dislocation in GaN crystal 12 is preferably not higher than $3 \times 10^6$ cm$^{-2}$ and further preferably not higher than $1 \times 10^6$ cm$^{-2}$. By working such a GaN crystal, a GaN substrate in which average density of dislocation penetrating a main surface 12m is preferably not higher than $3 \times 10^6$ cm$^{-2}$ and further preferably not higher than $1 \times 10^6$ cm$^{-2}$ is readily obtained. Here, average density of dislocation in GaN crystal 12 and average density of dislocation penetrating main surface 12m of the GaN substrate (average dislocation density) are calculated based on measurement of dark spot density with CL (cathode luminescence).

Referring to FIG. 1(A), in the step of growing GaN crystal 12, to which an impurity has been added, preferably, a group III nitride substrate (underlying substrate 11) in which an absolute value of an off angle of a main surface 11m from any plane of a {0001} plane, a {10-10} plane, a {11-20} plane, a {10-11} plane, a {11-22} plane, a {20-21} plane, and a {22-44} plane is not greater than 5° is used so as to grow GaN crystal 12 in which an absolute value of an off angle of main surface 12m for crystal growth from any plane of the {0001} plane, the {10-10} plane, the {11-20} plane, the {10-11} plane, the {11-22} plane, the {20-21} plane, and the {22-44} plane is not greater than 5°. From such a GaN crystal, GaN substrate 10 in which an absolute value of an off angle of a main surface 10*m* from any plane of the {0001} plane, the {10-10} plane, the {11-20} plane, the {10-11} plane, the {11-22} plane, the {20-21} plane, and the {22-44} plane is not greater than 5° is readily obtained.

(Step of Forming GaN Substrate by Working GaN Crystal)

Referring to FIG. 1(B), in the step of forming GaN substrate 10 by working obtained GaN crystal 12 to which an impurity has been added is not particularly restricted, and it can include a sub step of removing underlying substrate 11. A method of removing underlying substrate 11 is not particularly restricted, and a method of cutting using an outer peripheral cutting edge, an inner peripheral cutting edge, a wire saw, laser, and the like, a method of grinding with a diamond wheel or the like, and the like are available. GaN crystal 12 having main surfaces 12*m* and 12*n* is thus obtained.

The step of forming GaN substrate 10 by working GaN crystal 12 can also include a sub step of slicing GaN crystal 12. A method of slicing GaN crystal 12 is not particularly restricted, and a method of cutting using an outer peripheral cutting edge, an inner peripheral cutting edge, a wire saw, laser, and the like is available. In addition, the step can include a sub step of polishing a main surface of sliced GaN crystal 12 and/or subjecting the same to surface treatment. A method of polishing the main surface of GaN crystal 12 includes, for example, mechanical polishing, chemical-mechanical polishing, and the like. A method of treating the main surface of GaN crystal 12 includes such methods as dry etching, wet etching, and the like.

The step of forming GaN substrate 10 by working GaN crystal 12 can also include a sub step of removing an outer peripheral region of GaN crystal 12. A method of removing an outer peripheral region of GaN crystal 12 is not particularly restricted, and a method of grinding with a diamond wheel or the like is available.

Through one or more sub step above, GaN substrate 10 is obtained from GaN crystal 12. GaN substrate 10 according to the present embodiment obtained with the method of manufacturing a GaN substrate above has average density of dislocation penetrating the main surface thereof (average dislocation density), preferably not higher than $3 \times 10^6$ cm$^{-2}$ and further preferably not higher than $1 \times 10^6$ cm$^{-2}$. As such average density of dislocation is lower, a more reliable light-emitting device is obtained. From a point of view of the state-of-the-art technique for manufacturing a substrate, it is at present difficult to make average density of dislocation penetrating the main surface smaller than $1 \times 10^4$ cm$^{-2}$, and therefore it is approximately $1 \times 10^4$ cm$^{-2}$ or higher.

In addition, the GaN substrate according to the present embodiment obtained with the method of manufacturing a GaN substrate above has a flat main surface and a radius of curvature of a crystal plane closest to the main surface is preferably 10 m or greater and further preferably 20 m or greater. As such a radius of curvature of the crystal plane is greater, a light-emitting device having high in-plane uniformity of a light emission wavelength is obtained. In addition, from a point of view of the state-of-the-art technique for manufacturing a substrate, it is at present difficult to make a radius of curvature of the crystal plane closest to the main surface greater than 100 m, and therefore it is approximately 100 m or smaller.

[Light-Emitting Device]

Figure 3:
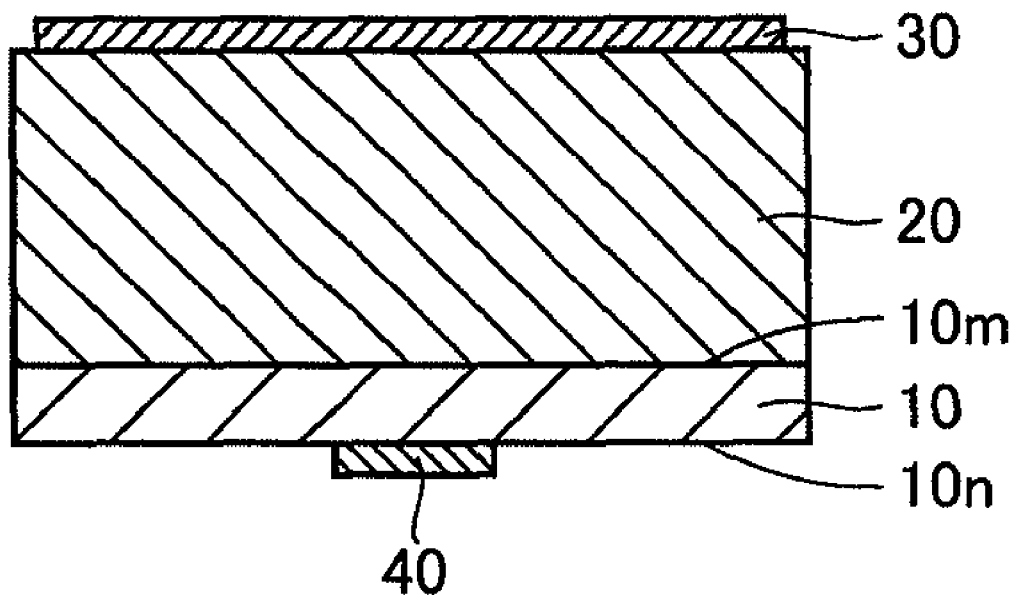
FIG. 3 is a schematic cross-sectional view showing an example of a light-emitting device according to the present invention.

FIG. 3 is a schematic cross-sectional view showing an example of a light-emitting device according to the present invention. Referring to FIG. 3, the light-emitting device according to the present invention includes GaN substrate 10 according to the first embodiment or the second embodiment above, and has a light emission peak wavelength not shorter than 500 nm and not longer than 780 nm or not shorter than 440 nm and not longer than 780 nm. The light-emitting device according to the present invention is low in light absorption coefficient at the substrate, for light in a wavelength region not shorter than 500 nm and not longer than 780 nm or not shorter than 440 nm and not longer than 780 nm, and it is high in light emission efficiency.

Referring to FIG. 3, more specifically, the light-emitting device according to the present invention includes GaN substrate 10 according to the first embodiment or the second embodiment above, at least one semiconductor layer 20 formed on one main surface 10*m* of GaN substrate 10, a first electrode 30 formed on an outermost layer of semiconductor layer 20, and a second electrode 40 formed on the other main surface 10*n* of GaN substrate 10. Such a light-emitting device includes a light-emitting layer in semiconductor layer 20 and emits light from the side of GaN substrate 10. A more specific embodiment will be described hereinafter.

Third Embodiment

Referring to FIG. 3, the light-emitting device according to the present embodiment includes GaN substrate 10 having an absorption coefficient not lower than 7 cm$^{-1}$ for light having a wavelength of 380 nm and light having a wavelength of 1500 nm, an absorption coefficient lower than 7 cm$^{-1}$ for light having a wavelength not shorter than 500 nm and not longer than 780 nm, and specific resistance not higher than 0.02 Ωcm, at least one semiconductor layer 20 formed on one main surface 10*m* of GaN substrate 10, first electrode 30 formed on the outermost layer of semiconductor layer 20, and second electrode 40 formed on the other main surface 10*n* of GaN substrate 10, and it has a light emission peak wavelength not shorter than 500 nm and not longer than 780 nm.

Fourth Embodiment

Referring to FIG. 3, the light-emitting device according to the present embodiment includes GaN substrate 10 having an absorption coefficient not lower than 7 cm$^{-1}$ for light having a wavelength of 380 nm and light having a wavelength of 1500 nm, an absorption coefficient lower than 7 cm$^{-1}$ for light having a wavelength not shorter than 440 nm and not longer than 780 nm, and specific resistance not higher than 0.02 Ωcm, at least one semiconductor layer 20 formed on one main surface 10*m* of GaN substrate 10, first electrode 30 formed on the outermost layer of semiconductor layer 20, and second electrode 40 formed on the other main surface 10*n* of GaN substrate 10, and it has a light emission peak wavelength not shorter than 440 nm and not longer than 780 nm.

By changing a chemical composition and/or a structure of semiconductor layer 20 in the light-emitting devices according to the third embodiment and the fourth embodiment above, a wavelength region and a peak wavelength of light emission can be changed.

[Method of Manufacturing Light-Emitting Device]

A method of manufacturing a light-emitting device according to the present invention is not particularly restricted, however, for example, referring to FIG. 3, the method includes the step of preparing GaN substrate 10 according to the first embodiment or the second embodiment, the step of forming at least one semiconductor layer 20 on one main surface of GaN substrate 10, the step of forming first electrode 30 formed on the outermost layer of semiconductor layer 20, and the step of forming second electrode 40 on the other main surface 10*n* of GaN substrate 10. Here, any of the step of forming first electrode 30 and the step of forming second electrode 40 may be performed first. The light-emitting device according to the third embodiment or the fourth embodiment is thus obtained.

(Step of Preparing GaN Substrate)

A method of preparing the GaN substrate according to the first embodiment or the second embodiment is as described in the method of manufacturing a GaN substrate above.

(Step of Forming at Least One Semiconductor Layer on GaN Substrate)

A method of forming at least one semiconductor layer 20 on one main surface 10m of GaN substrate 10 is not particularly restricted, however, from a point of view of epitaxial growth of semiconductor layer 20 having good crystallinity on the GaN substrate, such vapor phase methods as the MOCVD method, the MBE method, and the HVPE method are preferred. In addition, by changing a chemical composition and/or a structure of semiconductor layer 20, a wavelength region and a peak wavelength of light emission can be changed.

(Step of Forming First Electrode and Second Electrode)

A method of forming the first electrode and the second electrode is not particularly restricted, however, from a point of view of enhancing productivity and reducing production cost, a sputtering method, a vapor deposition method, and the like are preferred.

EXAMPLES

Example 1

In the present example, by changing a partial pressure of a doping gas containing Si in the HVPE method with the following method, a plurality of GaN substrates different from one another in carrier concentration, specific resistance and light absorption coefficient were obtained.

1. Preparation of Underlying Substrate

Referring to FIG. 1(A), initially, GaN underlying substrate 11 having a diameter of 60 mm and a thickness of 400 μm was prepared. Main surface 11m of underlying substrate 11 was flat and the crystal plane closest to main surface 11m was the (0001) plane. The radius of curvature of the (0001) plane was 20 m as a result of measurement with X-ray diffraction. Average density of dislocation penetrating main surface 11m of underlying substrate 11 (referred to as average dislocation density; to be understood similarly hereinafter) was $5 \times 10^5$ $cm^{-3}$ as a result of calculation based on measurement of dark spot density with CL (cathode luminescence).

2. Growth of GaN Crystal

Referring next to FIG. 1(A), with the HVPE method, seven GaN crystals 12 different in Si concentration were grown on underlying substrate 11 by using the $SiF_4$ gas as a doping gas (Experiments Nos. 1 to 7).

The HVPE apparatus shown in FIG. 2 was used for growing these GaN crystals. The $NH_3$ gas was prepared as first source gas G1, the HCl gas was prepared as second source gas G3, the $SiF_4$ gas was prepared as doping gas G2, and the $H_2$ gas having purity of 99.999% or higher was prepared as the carrier gas. The carrier gas was introduced into reaction tube 110 through each of first gas introduction pipe 104, second gas introduction pipe 106 and doping gas introduction pipe 105, and the temperature of heater 109 was raised to 1100° C. Thereafter, metal Ga was supplied to source boat 107 and source boat 107 was heated.

The HCl gas supplied through second gas introduction pipe 106 and Ga in source boat 107 were caused to react as $Ga+HCl \rightarrow GaCl+1/2H_2$, to thereby generate the GaCl gas as reaction gas G7.

Then, the $NH_3$ gas serving as first source gas G1 supplied through first gas introduction pipe 104 and the GaCl gas which is reaction gas G7 obtained in the reaction above were fed together with the carrier gas so as to impinge the main surface of underlying substrate 11 on which the GaN crystal is to be grown, and reaction was caused on that main surface as follows: $GaCl+NH_3 \rightarrow GaN+HCl+H_2$.

As a condition for growing seven GaN crystals 12 different in Si concentration (Experiments Nos. 1 to 7), a supply partial pressure of the doping gas was adjusted to values shown in Table 1. Thus, seven GaN crystals each having a diameter of 60 mm and a thickness of 5 mm but different in Si concentration were grown at a crystal growth temperature of 1100° C. in a crystal growth period of 16.67 hours. A rate of growth of these GaN crystals was 300 μm/hr.

3. Formation of GaN Substrate

Referring next to FIG. 1(B), each obtained GaN crystal 12 was sliced in a direction of thickness with the use of a slicer. Then, an outer peripheral region of sliced GaN crystal 12 was removed. Then, the sliced GaN crystal of which outer peripheral region had been removed was subjected to CMP (chemical-mechanical polishing), to thereby remove its affected layer. Thus, five GaN substrates 10 each having a diameter of 2 inches (50.8 mm) and a thickness of 400 μm were obtained from each GaN crystal.

4. Measurement of Physical Property of GaN Substrate

At five measurement points in a GaN substrate 10c third from the side of underlying substrate 11 among five obtained GaN substrates 10a, 10b, 10c, 10d, and 10e, Si concentration, carrier concentration, specific resistance, and absorption coefficient for light having wavelengths of 380 nm, 500 nm to 780 nm, 440 nm to 780 nm, and 1500 nm were measured, and minimum values and maximum values thereof were calculated. Here, the five measurement points were set as five points in total in one GaN substrate, that is, a central point on the main surface, points distant by −2 cm and +2 cm from the central point in a [11-20] direction respectively, and points distant by −2 cm and +2 cm from the central point in a [10-10] direction respectively. Here, Si concentration was measured with SIMS (secondary ion mass spectrometry). Carrier concentration was measured with the CV characteristics measurement method. Specific resistance was measured with the four-probe method by using a specific resistance meter. The light absorption coefficient was calculated by measuring transmittance and reflectance by using a spectrophotometer. Here, assuming that the absorption coefficient within the GaN substrate is constant regardless of a depth, multiple reflection was also taken into account. Table 1 summarizes the results.

Here, fluctuation in carrier concentration within the main surface of the GaN substrate was within ±5% from an average value, and fluctuation in carrier concentration in a direction of thickness was also within ±5% from the average value.

In addition, average density of dislocation penetrating the main surface at the five measurement points above in third GaN substrate 10c of each GaN crystal 12 (average dislocation density) was each $5 \times 10^5$ $cm^{-2}$, and it was as low as in underlying substrate 11. In addition, the radius of curvature of the (0001) plane at the five measurement points above in third GaN substrate 10c of each GaN crystal 12 was 20 m as a result of measurement with X-ray diffraction, and it was as great as in the underlying substrate. Moreover, the obtained GaN substrate had no crack.

TABLE 1

| Experiment No. | | 1 | 2 | 3 | 4 | 5 | 6 | 7 |
|---|---|---|---|---|---|---|---|---|
| Partial Pressure of Doping Gas ($\times 10^{-6}$ atm) | | 2.0 | 1.5 | 1.0 | 0.8 | 0.6 | 0.4 | 0.3 |
| Si Concentration ($\times 10^{18}$ cm$^{-3}$) | | 2.2 | 1.6 | 1.1 | 0.85 | 0.69 | 0.45 | 0.36 |
| Carrier Concentration ($\times 10^{18}$ cm$^{-3}$) | | 2.1 | 1.5 | 1.1 | 0.82 | 0.66 | 0.42 | 0.35 |
| Specific Resistance ($\Omega$cm) | | 0.095 | 0.011 | 0.014 | 0.017 | 0.02 | 0.031 | 0.035 |
| Light Absorption Coefficient (cm$^{-1}$) | 380 nm | 48 | 33 | 24 | 19 | 15 | 11 | 9 |
| | 500-780 nm | 11-15 | 7-10 | 5-7 | 4-5 | 4-5 | 4 | 3 |
| | 440-780 nm | 11-22 | 7-15 | 5-10 | 4-6 | 4-5 | 4 | 3-4 |
| | 1500 nm | 29 | 20 | 16 | 12 | 10 | 8 | 6 |

Referring to Table 1, in the HVPE method, by adjusting the crystal growth temperature to a temperature not lower than 1000° C. and not higher than 1200° C. and the partial pressure of the doping gas containing Si to a partial pressure not lower than $0.6 \times 10^{-6}$ atm and not higher than $1.0 \times 10^{-6}$ atm and setting the carrier concentration not lower than $0.66 \times 10^{18}$ cm$^{-3}$ and not higher than $1.1 \times 10^{18}$ cm$^{-3}$, the GaN substrate having specific resistance not higher than 0.02 $\Omega$cm, an absorption coefficient not lower than 7 cm$^{-1}$ for light having a wavelength of 380 nm, an absorption coefficient lower than 7 cm$^{-1}$ for light having a wavelength from 500 nm to 780 nm, and an absorption coefficient not lower than 7 cm$^{-1}$ for light having a wavelength of 1500 nm was obtained. In addition, by adjusting the crystal growth temperature to a temperature not lower than 1000° C. and not higher than 1200° C. and the partial pressure of the doping gas containing Si to a partial pressure not lower than $0.6 \times 10^{-6}$ atm and not higher than $0.8 \times 10^{-6}$ atm and setting the carrier concentration not lower than $0.66 \times 10^{18}$ cm$^{-3}$ and not higher than $0.82 \times 10^{18}$ cm$^{-3}$, the GaN substrate having specific resistance not higher than 0.02 $\Omega$cm, an absorption coefficient not lower than 7 cm$^{-1}$ for light having a wavelength of 380 nm, an absorption coefficient lower than 7 cm$^{-1}$ for light having a wavelength from 440 nm to 780 nm, and an absorption coefficient not lower than 7 cm$^{-1}$ for light having a wavelength of 1500 nm was obtained. Regarding concentration of an impurity element other than Si in all grown crystals, concentration of O (oxygen) was not higher than $5 \times 10^{16}$ cm$^{-3}$, concentration of C (carbon) was not higher than $5 \times 10^{16}$ cm$^{-3}$, and concentration of other elements was again not higher than $1 \times 10^{16}$ cm$^{-3}$, as a result of measurement with SIMS.

In the examples above, a GaN substrate in which a crystal plane closest to a main surface is the (0001) plane was fabricated, however, similar results were obtained also when a GaN substrate in which a crystal plane closest to the main surface is the (10-10) plane, the (11-20) plane, the (10-11) plane, the (11-22) plane, the (20-21) plane, or the (22-44) plane was fabricated.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A GaN substrate, having an absorption coefficient not lower than 7 cm$^{-1}$ for light having a wavelength of 380 nm and light having a wavelength of 1500 nm, an absorption coefficient lower than 7 cm$^{-1}$ for at least light having a wavelength not shorter than 500 nm and not longer than 780 nm, and specific resistance not higher than 0.02 $\Omega$cm.

2. The GaN substrate according to claim 1, having an absorption coefficient lower than 7 cm$^{-1}$ for light having a wavelength not shorter than 440 nm and not longer than 780 nm.

3. A light-emitting device, comprising the GaN substrate according to claim 2 and having a light emission peak wavelength not shorter than 440 nm and not longer than 780 nm.

4. A light-emitting device, comprising the GaN substrate according to claim 1, and having a light emission peak wavelength not shorter than 500 nm and not longer than 780 nm.

* * * * *